United States Patent
Ishikawa

(10) Patent No.: US 7,262,127 B2
(45) Date of Patent: Aug. 28, 2007

(54) METHOD FOR CU METALLIZATION OF HIGHLY RELIABLE DUAL DAMASCENE STRUCTURES

(75) Inventor: Yoshimitsu Ishikawa, Yorktown Heights, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 387 days.

(21) Appl. No.: 11/040,366

(22) Filed: Jan. 21, 2005

(65) Prior Publication Data

US 2006/0166484 A1    Jul. 27, 2006

(51) Int. Cl.
H01L 21/76    (2006.01)
H01L 21/22    (2006.01)
H01L 21/4763    (2006.01)
H01L 21/44    (2006.01)
H01L 29/40    (2006.01)

(52) U.S. Cl. .................. 438/622; 438/445; 438/551; 438/552; 438/623; 438/624; 438/625; 438/675; 257/758

(58) Field of Classification Search .................... None
See application file for complete search history.

(56) References Cited

U.S. PATENT DOCUMENTS

| | | | |
|---|---|---|---|
| 6,376,366 B1 * | 4/2002 | Lin et al. ................ | 438/637 |
| 6,448,176 B1 * | 9/2002 | Grill et al. .............. | 438/637 |
| 6,566,258 B1 | 5/2003 | Dixit et al. .............. | 438/687 |
| 6,806,192 B2 | 10/2004 | Lin et al. ................ | 438/687 |
| 6,946,391 B2 * | 9/2005 | Tsai et al. ............... | 438/638 |
| 2003/0124859 A1 | 7/2003 | Cheung et al. .......... | 438/692 |
| 2003/0132510 A1 | 7/2003 | Barth et al. ............. | 257/637 |
| 2004/0092098 A1 * | 5/2004 | Sudijono et al. ......... | 438/637 |
| 2004/0132291 A1 | 7/2004 | Lee et al. ................ | 438/689 |
| 2004/0157453 A1 | 8/2004 | Delgadino et al. ...... | 438/691 |
| 2004/0173908 A1 | 9/2004 | Barth et al. ............. | 257/760 |
| 2004/0175581 A1 | 9/2004 | Nguyen et al. .......... | 428/447 |
| 2004/0175922 A1 | 9/2004 | Solomentsev et al. ... | 438/622 |
| 2004/0180188 A1 | 9/2004 | Nakata et al. ........... | 428/312.6 |

(Continued)

OTHER PUBLICATIONS

Jerry Healey, "Current Technical Trends: Dual Damascene & Low-K Dielectrics", *Threshold Systems*, 2002.

(Continued)

*Primary Examiner*—Carl Whitehead, Jr.
*Assistant Examiner*—James M Mitchell
(74) *Attorney, Agent, or Firm*—Mayer & Williams PC; Keum J. Park, Esq.

(57) ABSTRACT

The present invention provides a method for forming a void-free copper damascene structure comprising a substrate having a conductive structure, a first dielectric layer on the substrate, a diffusion barrier layer on the first dielectric layer, and a second dielectric layer on the barrier layer. The method comprises forming via and trench openings developing a photoresist through a first and second hard mask. The first hard mask is laterally etched such that it is eroded to a greater extent from the trench opening with respect to the underlying second dielectric layer. Remaining gap fill layer is removed and the diffusion barrier layer within the via opening is etched to expose the conductive structure. The via and trench openings are plated with a barrier metal and a copper seed layer to obtain copper features that fill the openings and form a void-free copper damascene structure.

20 Claims, 1 Drawing Sheet

U.S. PATENT DOCUMENTS

| | | | |
|---|---|---|---|
| 2004/0183202 A1 | 9/2004 | Usami | 257/762 |
| 2004/0195694 A1 | 10/2004 | Duncombe et al. | 257/759 |
| 2004/0198070 A1 | 10/2004 | Xia et al. | 438/786 |
| 2004/0201103 A1 | 10/2004 | Yau et al. | 257/758 |
| 2004/0203223 A1 | 10/2004 | Guo et al. | 438/637 |
| 2004/0209456 A1 | 10/2004 | Farrar | 438/627 |
| 2004/0214446 A1 | 10/2004 | Kim et al. | 438/706 |
| 2005/0079706 A1* | 4/2005 | Kumar et al. | 438/638 |

OTHER PUBLICATIONS

P.C. Andricacos, et al., "Damascene Copper Electroplating For Chip Interconnections", *I B M J. Res. Develop.*, Sep. 5, 1998, vol. 42, No. 5, pp. 567-574.

Stanley Wolf, Ph.D., "Introduction To Dual-Damascene Interconnect Processes", *Silicon Processing For the VLSI Era*, 2004, vol. 4, pp. 674-679.

P. Josh Wolf[1,4], PowerPoint presentation from International SeMaTech. "Overview of Dual Damascene Cu/Low-K Interconnect", Aug. 14, 2003, pp. 1-21.

Robert H. Havemann, et al., "High-Performance Interconnects: An Integration Overview", *Proceedings Of The IEEE*, May 5, 2001, vol. 89, No. 5, pp. 586-601.

Jiun-Yu Lai, et al., "Evolution of Copper-Oxide Damascene Structures in Chemical Mechanical Polishing", *Journal of the Electrochemical Society*, 2002, vol. 149 (1), pp. G31-G40.

Ping Xu, et al., "A Breakthrough in Low-k Barrier/Etch Stop Films for Copper Damascene Applications", *Semiconductor Fabtech*, 11th Edition, pp. 239-244, exact date unknown, but prior to the filing date of the instant application.

Sailesh M. Merchant, et al., "Copper Interconnects for Semiconductor Devices", *Microelectronic Processing Overview*, Jun. 2001, 1 page.

Johnny Ho, et al., "Tantalum Nitride Barrier Layer in Copper-Based ICs", 3 pages, exact date unknown, but prior to the filing date of the instant application.

"Evolution of Copper Oxide Damascene Structures In CMP: I. Contact Mechanics Modeling". Chapter 4, pp. 133-166, exact date unknown, but prior to the filing date of the instant application.

Michael E. Clarke, "Introducing Low-k Dielectrics Into Semiconductor Processing", *Application Notes*, 20 pages, www.mykrolis.com, exact date unknown, but prior to the filing date of the instant application.

Michel Lerme, "Multi Layer Metallization", 7 pages, exact date unknown, but prior to the filing date of the instant application.

"Back to the Future: Copper Comes of Age", http:domino.research.ibm.com/comm./wwwr_thinkresearch.nsf/pages/copper397.html Downloaded Nov. 15, 2004. 10 pages.

"Multilevel Wiring technology for Leading-Edge CMOS Devices in the 65nm Generation", *Sony Global-CX-News*, vol. 33. 3 pages. http://www.sony.net/Products/SC-HO/cx_news/vol33/featuring.html Downloaded Nov. 15, 2004.

Connie P. Wang, et al., "Binary Cu-Alloy Layers for Cu-Interconnections Reliability Improvement", 2001, *IEEE*, pp. 86-88.

Y. Matsubara, et al., "Thermally Robust 90nm Node Cu-Al Wiring Technology Using Solid Phase Reaction Between Cu and Al", 2003, *Symposium on VLSI Technology Digest of Technical Papers*, pp. 127-128.

\* cited by examiner

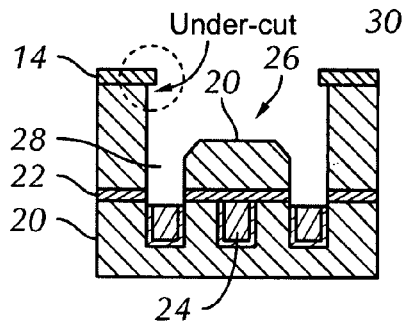
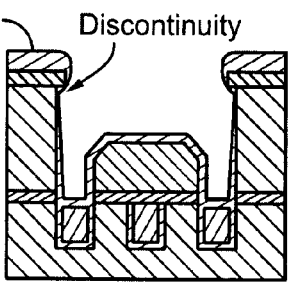
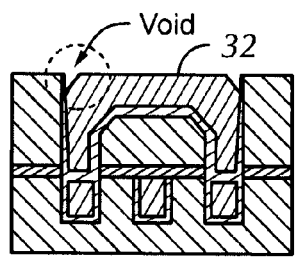
FIG. 1A
(Prior Art)
FIG. 1B
(Prior Art)
FIG. 1C
Prior Art)
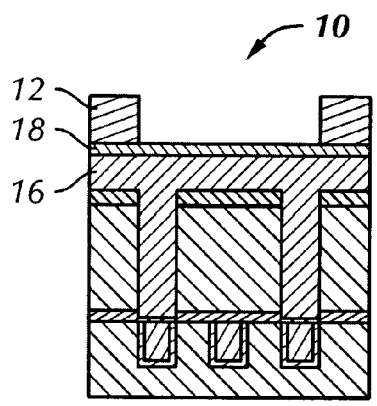
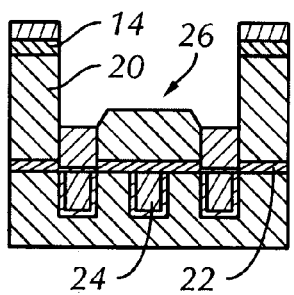
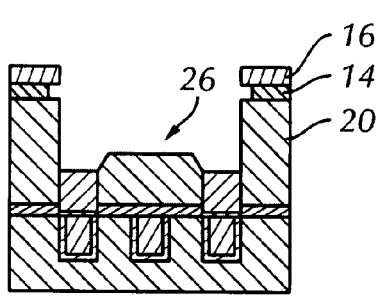
FIG. 2A
FIG. 2B
FIG. 2C
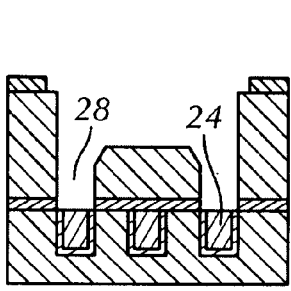
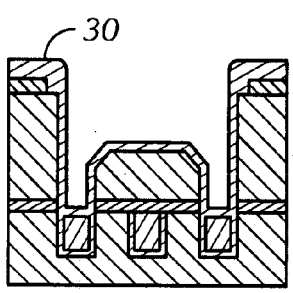
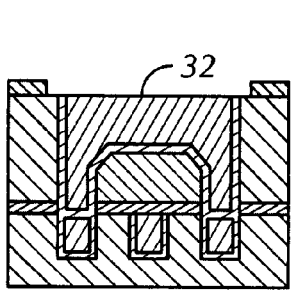
FIG. 2D
FIG. 2E
FIG. 2F

METHOD FOR CU METALLIZATION OF HIGHLY RELIABLE DUAL DAMASCENE STRUCTURES

FIELD OF THE INVENTION

The present invention relates generally to the field of integrated circuit devices, and more particularly, to methods for fabricating void-free dual damascene structures using a copper barrier/seed.

BACKGROUND

As CMOS transistor scaling proceeds into the deep submicron regime, the signal integration of many active elements has necessitated that many layers of high density metal interconnect. To reduce device resistance and capacitance ("RC"), the industry has moved away from aluminum interconnect metal with silicon dioxide dielectric between the metal lines to copper coupled with low-K interlayer dielectric ("ILD") materials in single and dual damascene structures. Copper metallization combined with low dielectric constant ("low-k") ILDs has resulted in the reduction of RC time constant delays in interconnect devices. This integration of copper with low-k materials is considered to be critical to the development of next-generation ultra-large-scale integrated circuit technologies. A variety of copper and low-k approaches and integration schemes are currently being explored.

Single and dual damascene processes are well-detailed in the literature (for example, see Steinbruchel, Christoph and Barry L. Chin, "Copper Interconnect Technology," SPIE Press, 2001). Briefly described, in a dual damascene process, both the via and trenches are etched in the dielectric layer overlying an underlying interconnect or trace. The desired metal is then deposited into the trenches and holes in one step to form a dual damascene structure. Chemical mechanical polishing ("CMP") is used to remove the unwanted surface metal, while leaving the desired metal in the trenches and holes, thus forming in-laid interconnect lines and vias that are coupled to electrical components beneath the insulation layer. The goal of CMP processing is to leave a planarized surface for subsequent metallization to build multi-level interconnections.

However, there exist special challenges for fabricating damascene structures made of copper inlay and low-k ILD materials that cannot be corrected by CMP processing. Surface irregularities and other topography issues such as dishing or erosion created during the etching, ashing, resist removal, and cleaning steps are potentially more damaging in dual-damascene than in non-damascene processes. Unlike aluminum processes, where CMP flattens out the dielectric before patterning, there is no topography correction in dual-damascene. Therefore, if a dip is created at metal 1, it will be transferred into the dielectric creating a dip at metal two, and create a potential short. Thus, critical to the damascene process are vertical via profiles with smooth side walls, particularly in a via-first damascene process. If the via is sloped, residual resist or hard mask can form a "fence" that can partially block the etch, thus rounding the edges of the via and reducing the cross-sectional area of copper from the line into the via. Fencing may also be formed during the trench etch step due to a thick gap-fill (e.g., BARC gap fill material) and with the use of highly polymerizing plasma etch chemistries.

Typical damascene structures used in leading-edge devices with up to eight levels of metal incorporate a barrier metal such as Ta/TaN that surround the copper on all sides, followed by a seed layer copper deposition and copper electroplating. Optimization of the process is needed to assure adequate barrier metal step coverage in preparation for bottom-up fill by copper electroplating. Typical etching and ashing techniques result in the pullback (erosion) of the dielectric film, and an increase in the effective k, particularly for low-k materials.

FIG. 1A shows an intermediate structure created during a conventional copper dual damascene process after via and trench etching has been completed and just prior to barrier metal and copper seed deposition. This structure shows an undercut hard mask layer 14 that protrudes slightly into the trench opening 26. The hard mask layer 14 lies over the trench sidewalls which comprise low-K ILD 20. Within the via openings 28 are conductive structures 24 which are covered with a copper diffusion barrier layer 22.

Typically, the stripping and etching involved in the via and trench formation will cause a portion of the dielectric layer 20 lying beneath the hard mask 14 to be eroded such that an undercut of the hard mask results. Thus, when a barrier metal layer 30 is formed on the via opening and trench opening with conductive materials such as copper (e.g., copper seeding followed by electroplating with copper atoms), as shown in FIG. 1B, the irregularity in the sidewall of the trench results in a discontinuity of the barrier metal layer 30 (e.g., electroplating of conductive atoms does not occur at the site of the discontinuity and thus a nonconformal coating results). FIG. 1C shows the structure after metal deposition is completed and has undergone planarization by CMP. However, the resulting damascene structure exhibits failure (e.g. voids) at the surface interface between the copper feature 32 and the dielectric layer 20. Such defects in the surface result in electromigration resistance within the structure and pose performance and reliability issues in the finished devices.

Thus, while the conventional damascene processes are workable, there remains room for improvement. It would be desirable to provide a process for the formation of void-free damascene structures with precise planarization.

SUMMARY OF THE INVENTION

The present invention provides a method for forming a void-free copper damascene structure comprising a substrate having a conductive structure, a first dielectric layer on the substrate, a diffusion barrier layer on the first dielectric layer, and a second dielectric layer on the barrier layer. The method comprises forming via and trench openings developing a photoresist through a first and second hard mask. The first hard mask is laterally etched such that it is eroded to a greater extent from the trench opening with respect to the underlying second dielectric layer. Remaining gap fill layer is removed and the diffusion barrier layer within the via opening is etched to expose the conductive structure. The via and trench openings are plated with a barrier metal and a copper seed layer to obtain copper features that fill the openings and form a void-free copper damascene structure.

It is an object of the present invention to provide improved processes for fabrication of damascene structures. Another object is to provide damascene structures free of surface defects in the manufacture of integrated circuits.

These objects have been achieved by providing a hard mask pull-out step prior to stripping of the gap fill material and the etching of the barrier layer.

BRIEF DESCRIPTION OF THE DRAWINGS

FIGS. 1A-1C are schematic illustrations of various stages of a prior art process for forming a dual damascene structure. FIG. 1A illustrates an intermediate structure created during a dual-damascene process showing an undercut of the embedded hard mask that results after via and trench etching and prior to barrier metal layer and copper seeding deposition. FIG. 1B illustrates copper seed deposition and barrier metal layer formation on the structure of FIG. 1A showing a discontinuity in the barrier metal layer at the junction between the undercut hard mask and the underlying dielectric layer. FIG. 1C is a schematic illustration after CMP of the structure of FIG. 1B showing surface defects.

FIGS. 2A-2F are schematic illustrations of various stages in the formation of a void-free dual damascene structure according to an embodiment of the present invention.

FIG. 2A illustrates a multi-layer composite 10 prior to trench etching formed according to a via-first dual damascene method. FIG. 2B is a schematic illustration after trench etching and further processing of the composite structure of FIG. 2A. FIG. 2C illustrates the structure after pull-back (i.e., erosion) of the embedded hard mask so that the hard mask is laterally etched and is overcut with respect to the underlying low-k ILD layer. FIG. 2D illustrates further processing of the structure of FIG. 2C to strip the gap fill material and etching of the barrier layer. FIG. 2E illustrates the structure after deposition of a barrier metal and copper seeding to form a conformal coating. FIG. 2F illustrates a planarized damascene structure after CMP.

DETAILED DESCRIPTION OF PREFERRED EMBODIMENTS

A more complete understanding of the method and apparatus of the present invention is available by reference to the following detailed description of the embodiments when taken in conjunction with the accompanying drawings. The detailed description of the embodiments which follows is intended to illustrate but not limit the invention. The scope of the invention is defined by the appended claims.

The present invention provides a method for forming a void-free copper damascene structure from a composite comprising a substrate having a conductive structure, a first dielectric layer on the substrate, a diffusion barrier layer on the first dielectric layer, and a second dielectric layer on the barrier layer. The method comprises forming a via opening by etching the second dielectric layer, the diffusion barrier layer and the first dielectric layer to expose the conductive structure by developing a photoresist through a first hard mask which defines a via opening. The via opening is then filled with a gap fill material to form a gap fill layer. Optionally, the gap fill is planarized by a CMP or other process. A portion of the gap fill layer is removed to a first depth and the second dielectric layer is etched to about a first depth by developing the photoresist through a second hard mask which defines a trench opening. In other embodiments, a portion of the gap fill material and the second dielectric layer are etched together by developing the photoresist through a second hard mask. The first hard mask is laterally etched such that it is eroded to a greater extent from the trench opening with respect to the underlying second dielectric layer. Remaining gap fill layer is removed and the diffusion barrier layer within the via opening is etched to expose the conductive structure. The via and trench openings are plated with a barrier metal and a copper seed layer to obtain copper features that fill the openings and form a copper damascene structure.

According to one embodiment of the present invention, a method for forming a void-free dual damascene structure on a substrate is disclosed. Referring to FIG. 2A, a multi-layer composite 10 prior to trench etching is shown in a via-first dual damascene process. Via lithography is completed, and then the vias are filled with a gap fill material 16 to planarize the topography prior to trench etching. FIG. 2A illustrates a photoresist layer 12, a first hard mask layer 14, a gap fill material 16, a second hard mask layer 18, a low-k ILD layer 20, conductive structure 24, and an optional diffusion barrier layer 22. Copper atoms can easily diffuse through most oxides into the devices in the underlying silicon substrate (not shown) and act as recombination centers to spoil device performance and may also diffuse into the dielectric material, resulting in conductivity of these insulators and higher effective dielectric constants. Thus, a diffusion barrier layer 22 serves as a diffusion barrier preventing materials from the conductive structure from diffusing into the dielectric layer 20. A diffusion barrier layer 22 can comprise, for example, silicon oxynitride or other suitable diffusion barrier materials, all of which are within the scope of the present invention.

The photoresist 12 is patterned to form openings. The second dielectric layer (e.g., a low-k ILD) 20 is coated with a photoresist 12 that is exposed through a first hard mask 14 to pattern openings corresponding to vias 28. An etching step such as anisotropic etching removes the dielectric beneath the patterned openings, transferring the via pattern into the dielectric layer 20. A gap fill material 16 is applied to the second dielectric layer 20 and to the vias 28 to create a greater planar topography for trench patterning, to protect the bottom of via 28 from damage during the trench etch, and to prevent fence problems. The photoresist 12 is then exposed through a second hard mask layer 18 with an image pattern corresponding to conductive lines aligned with the via openings 28. It is important to maintain critical dimension ("CD") during the photolithography process. If the CD of the trench after photolithography is out of a predetermined specification requirement, the photoresist 12 is removed by dry and/or wet etching and the photolithography process is repeated until correct trench CD is achieved. In order to shield gap fill materials 16 which are typically constructed of organic materials that become consumed when contacted with dry or wet etching relating to the photoresist 12, a second hard mask 18 is placed under the photoresist 12. Any of a number of standard hard mask materials may be employed for the second hard mask 18, including but not limited to silicon oxide and silicon nitride based films (e.g., $SiO_2$ or $Si_3N_4$).

As shown in FIG. 2B, a second anisotropic etching process ("trench etching") has removed the low-k ILD in a pattern corresponding to the conductive lines. This second etching process is controlled so that only a portion of the low-k dielectric layer is removed where conductive lines are desired. Thus, trenches are formed in the dielectric which can be filled to form the conductive lines. Some of the gap fill material 16 remains to insulate the conductive lines from the underlying substrate except where vias, corresponding to the first hard mask, are formed entirely through the first dielectric layer 20. The second hard mask 18 becomes etched away during the trench etching.

As would be appreciated by one of skill in the art, there are many different types of low-k ILD materials available which may be utilized for the practice of the methods of the present invention. The two main classes of these low-k ILD materials are chemical vapor deposition (CVD) and inorganic or organic spin-on dielectric (SOD) films (e.g., BCB, Flare, SiLK™, and parylene AF4). In some embodiments, the low-k ILD material comprises doped silicon oxide materials (e.g., Coral™, HOSP, HSQ(Fox-15,17)) and fluorinated and non-fluorinated organic polymers. As would be appreciated by one of skill in the art, dielectric materials doped with a variety of doping agents are known and readily available. In one particular embodiment, the low-k ILD comprises a fluorinated silicon compound such as silicon oxyfluoride.

As used herein, by low-k ILD is meant a dielectric having a dielectric constant of less than about 4.0, and preferably, less than about 3.0. There is a large number of low-k ILDs with a dielectric constant below 3.0 currently available on the market, such as BCB, porous HSQ, MSQ, and SiLK™ (Dow Chemical Company). SiLK™, for example, has a dielectric constant of 2.7 and is a planarizing aromatic hydrocarbon that does not contain any fluorine. Since an oxygen containing chemistry is typically used to etch SiLK™ and other low-k ILDs, a second hard mask 18 is typically inserted underneath the photoresist 12 to maintain critical dimension ("CD") integrity as the photoresist gets etched along with the low-k material. The hard mask open step and low-k etch are performed in the same chamber. The hard mask typically serves several functions. Many low-k films are hydrophilic in character. Thus, traditionally, the surface hard mask 18 that is located on top of the ILD stack shields the ILDs from moisture during the copper chemical mechanical polishing ("CMP") process, protects the ILD from aggressive cleans, blocks copper diffusion and also typically act as a CMP stop.

Through experimentation, Applicant has learned that incorporating a separate step for the selective pull-back (e.g., erosion) of the first hard mask 14 after the via and trench etchings encourages conformal deposition of the barrier metal/copper seed 30 during the metal electroplating process. Unexpectedly, Applicant has learned that lateral erosion of a small portion of the first hard mask 14 which lies above the underlying low-k ILD layer 20 at the trench sidewall facilitates rather than hinders void-free deposition of the barrier metal/copper seeding 30 in subsequent conductive coating steps. This is a departure from typical hard masks which are specifically designed and selected so that they are consumed at a lower rate than that of the underlying dielectric and gap fill materials. Applicant has further discovered that utilizing a first hard mask 14 with a chemical erosion rate greater than that of the low-k ILD 20 and gap fill 16 materials prevents the common hard mask undercut that commonly occurs as a result of the multitude of etching and stripping steps in damascene processing. This hard mask undercut has traditionally caused poor copper seed step coverage and discontinuities during barrier metal deposition. By eliminating the hard mask undercut, a vertical trench sidewall profile is achieved during barrier metal deposition.

As mentioned above, the critical part of the invention is the addition of a lateral pull-back of the first hard mask 14, the lower of the two masks on the composite 10 that defined the boundaries of the vias 28 during the via etching step. As would be appreciated by one of skill in the art, the lateral erosion of the hard mask 14 relative to the underlying dielectric layer 20 such as a low-k ILD material, can be achieved by any number of chemical or physical etching means for instance, by utilizing a slightly higher bias in a plasma or other "dry" etch process to laterally erode the mask. Although a variety of etching processes may be used to selectively etch the first hard mask, in some preferred embodiments, chemical or "wet" etch processes are utilized. In one preferred embodiment, the first hard mask 14 is etched in a diluted HF ("DHF"), typically a 0.1 wt % to wt 1% solution.

In one particularly preferred embodiment, lateral erosion of the first hard mask is achieved by selecting a hard mask material having a chemical etching rate that is higher than that of the low-k ILD material and/or gap fill material for a particular etchant. For example, it is preferable that the selectivity ratio of photoresist to low-k material or gap fill material is greater than 1:1, more preferably 10:1 and even more preferably, 20:1. Other method such as a low-ion plasma etch, i.e., a plasma with a reduced ion/electron content, can also be utilized during the separate first hard mask etch step.

Thus, in some embodiments, the first hard mask comprises a dielectric material with an etch selectivity higher than that of the low-k ILD material and/or gap fill material. In one particularly preferred embodiment, the low-k ILD comprises a doped silicon compound, e.g., carbon doped silicon, SiCOH, the gap fill material comprises an anti-reflective polymer material (e.g., BARC), the first hard mask comprises SiO, and these materials are chemically etched using a wet etch comprising DHF. Any of a number of chemical etchants may be utilized, preferably wet anisotropic etchants. In this example, the carbon doped silicon, SiCOH, has a lower selectivity for many chemical etchants such as DHF than SiO. Thus, SiCOH was selected as the low-k ILD material and an undoped silicon compound, SiO, was used for the hard mask 14. This ensures lateral pull back of the hard mask 14 such that an undercut with respect to the underlying low-k ILD layer is avoided. As will be understood by one of skill in the art, the materials for the hard mask 14, low-k ILD 20, and the gap fill material 16 may be readily selected based upon Applicant's criterion that for a particular etching compound or process, the etch rate of the hard mask 14 is equal to or greater than that of the low-k ILD or the gap fill material.

FIG. 2C illustrates the structure after pull-back (i.e., erosion) of the embedded hard mask 14 so that the hard mask 14 is laterally etched and is overcut with respect to the underlying low-k ILD layer 20 and the overlying gap fill material 16. FIG. 2D illustrates that even after further processing of the structure of FIG. 2C to strip the gap fill material 16 and to etch the diffusion barrier layer 22, the first hard mask 14 is further eroded from the sidewalls of the trench than the underlying low-k ILD material 20. The gap fill material 16 may be any organic or inorganic material suitable for reducing via fill bias and planarize the topography of a structure during damascene processing. Gap fill materials 16 may comprise, for example, modified i-line photoresists, dielectrics, anti-reflective materials (e.g., bottom-anti-reflective coating BARC), or polymeric materials such as novolak, poly(hydroxystyrene), acrylate, methacrylate, and cyclo alicyclic copolymer with maleic anhydride (COMA), with or without anti-reflective properties. Again, the gap fill material is selected using the criterion that, for a particular etch material or etch process, the selectivity of the gap fill material is lower than that of the first hard mask 14. The gap fill material 16 may be stripped by, for example, by a chemical etch, an etch back using either a reactive ion etch (RIE) process or chemical mechanical polishing (CMP).

FIG. 2E illustrates the structure after deposition of a barrier metal and copper seeding layer 30 to form a conductive copper feature 32 on the via and trench openings. The barrier metal/seed 30 is deposited such that the layer is electrically continuous with the conducting structure 24. Although the deposited barrier metal is preferably copper, any metal may be used. A copper seed layer may contain copper, either unalloyed or formed of an alloy with one or more elements, including but not limited to, Pd, Ag, Au, Al, Zn, Mg, Zr, Sn, or Ni. The seed layer is deposited by known means such as CVD deposition or sputter deposition.

Whereas in the prior art process, the barrier metal/copper seed layer 30 was deposited over a protruding hard mask undercut, causing a coating discontinuity in the vertical walls of the trench (see FIG. 1B), in FIG. 2E, the barrier metal has deposited on the laterally recessed hard mask and the rest of the surfaces of the trench and vias, and has restored a smooth vertical surface to the sidewalls of the trench. After completion of the deposition, the structure is subject to CMP and the resulting planarized damascene structure is illustrated in FIG. 2F.

Although various embodiments are specifically illustrated and described herein, it will be appreciated that modifications and variations of the invention are covered by the above teachings and are within the purview of the appended claims without departing from the spirit and intended scope of the invention. Furthermore, these exemplary embodiments should not be interpreted to limit the modifications and variations of the invention covered by the claims but are merely illustrative of possible variations.

What is claimed is:

1. A method for forming a void-free copper damascene structure from a composite comprising a substrate having a conductive structure, a first dielectric layer on said substrate, a diffusion barrier layer on said first dielectric layer, and a second dielectric layer on said barrier layer, said method comprising:
    forming a via opening by etching said second dielectric layer, said diffusion barrier layer and said first dielectric layer, said etching comprising exposing said conductive structure by developing said photoresist through a first hard mask which defines a via opening, and said first hard mask is situated over an underlying second dielectric layer;
    filling at least the via opening with a gap fill material to form a gap fill layer;
    etching said gap fill layer and second dielectric layer to about a first depth by developing said photoresist through a second hard mask which defines a trench opening;
    laterally etching the first hard mask such that it is eroded to a greater extent from a sidewall of the trench opening than the underlying second dielectric layer;
    removing remaining gap fill layer and diffusion barrier layer within the via opening to expose the conductive structure;
    plating the via and trench openings with a barrier metal and a copper seed layer to obtain copper features that fill the openings and to form a copper damascene structure.

2. The method of claim 1, wherein the first and second dielectric materials comprise a low-k interlayer dielectric material.

3. The method of claim 2, wherein the low-k dielectric material comprises an inorganic or organic spin-on dielectric film.

4. The method of claim 2, wherein the low-k dielectric material comprises a fluorinated or non-fluorinated organic polymer.

5. The method of claim 2, wherein the low-k dielectric material comprises a doped silicon oxide film.

6. The method of claim 1, wherein a chemical etch rate of the first hard mask is equal to or greater than a chemical etchant rate of the gap fill material or the second dielectric layer for a predetermined chemical etchant.

7. The method of claim 1, wherein materials for the first hard mask, the gap fill material and the second dielectric layer are selected such that for a predetermined etching method, the first hard mask erodes at a higher selectivity than that of the gap fill material or the second dielectric layer.

8. The method of claim 1, wherein the first and the second dielectric layers comprise the same material.

9. The method of claim 1, wherein the first and the second dielectric layers comprise the same or different low-k interlayer dielectric material comprising an organic polymer.

10. The method of claim 1, wherein the lateral etching step of the first hard mask comprises a dry strip process.

11. The method of claim 1, wherein the lateral etching step of the first hard mask comprises a low-ion plasma process.

12. The method of claim 1, wherein the dielectric constant, k, of the low-k interlayer dielectric is less than or equal to about 3.0.

13. The method of claim 1, wherein an etch selectivity ratio of the first hard mask to the low-k interlayer dielectric is greater than about 1:1.

14. The method of claim 1, wherein an etch selectivity ratio of the first hard mask to the low-k interlayer dielectric is greater than about 10:1.

15. The method of claim 1, wherein an etch selectivity ratio of the first hard mask to the low-k interlayer dielectric is greater than about 20:1.

16. The method of claim 1, wherein the gap fill material comprises modified i-line photoresists, dielectrics, anti-reflective materials, or polymeric materials such as novolak, poly(hydroxystyrene), acrylate, methacrylate, or cyclo alicyclic copolymer with maleic anhydride.

17. The method of claim 1, wherein the gap fill material comprises an anti-reflective material comprising a bottom-anti-reflective coating (BARC).

18. The method of claim 1, wherein the method further comprises the step of planarizing the filled copper features with a chemical mechanical polishing process.

19. The method of claim 1, wherein the filling of the openings to form a copper damascene structure comprises depositing the copper seed and barrier metal such that said formed copper feature is electrically continuous with said conductive structure.

20. The method of claim 1, wherein the second dielectric layer comprises a doped silicon compound, the first hard mask comprises an undoped silicon compound and the hard mask is laterally etched with a diluted HF solution.

* * * * *

UNITED STATES PATENT AND TRADEMARK OFFICE
CERTIFICATE OF CORRECTION

PATENT NO. : 7,262,127 B2  Page 1 of 1
APPLICATION NO. : 11/040366
DATED : August 28, 2007
INVENTOR(S) : Yoshimitsu Ishikawa It is certified that error appears in the above-identified patent and that said Letters Patent is hereby corrected as shown below:

Drawings: FIG. 1C, before "Prior Art)", insert -- ( --.

Specification, Col. 1, Line 56, after "metal", change "1" to -- one --.

Specification, Col. 4, Line 50, after "hard", change "mask18" to -- mask 18 --.

Specification, Col. 6, Line 13, before "method", change "Other" to -- Another --.

Specification, Col. 6, Line 61, after "example", delete -- by --.

Signed and Sealed this

First Day of April, 2008

JON W. DUDAS
*Director of the United States Patent and Trademark Office*